(12) United States Patent
Lee et al.

(10) Patent No.: US 7,728,419 B2
(45) Date of Patent: Jun. 1, 2010

(54) SEMICONDUCTOR PACKAGE ADAPTED FOR HIGH-SPEED DATA PROCESSING AND DAMAGE PREVENTION OF CHIPS PACKAGED THEREIN AND METHOD FOR FABRICATING THE SAME

(75) Inventors: Seung Hyun Lee, Gyeonggi-do (KR); Seung Taek Yang, Seoul (KR)

(73) Assignee: Hynix Semiconductor Inc., Kyoungki-so (KR)

( * ) Notice: Subject to any disclaimer, the term of this patent is extended or adjusted under 35 U.S.C. 154(b) by 247 days.

(21) Appl. No.: 11/854,067

(22) Filed: Sep. 12, 2007

(65) Prior Publication Data

US 2009/0026591 A1 Jan. 29, 2009

(30) Foreign Application Priority Data

Jul. 27, 2007 (KR) .................. 10-2007-0076007

(51) Int. Cl.
*H01L 23/48* (2006.01)
(52) U.S. Cl. ........................ 257/690; 257/778
(58) Field of Classification Search .......... 257/690, 257/692, 693, 778
See application file for complete search history.

(56) References Cited

U.S. PATENT DOCUMENTS

2009/0026591 A1 * 1/2009 Lee et al. ................ 257/676

FOREIGN PATENT DOCUMENTS

KR 2001-75962 A 8/2001
KR 2004-105560 A 12/2004

* cited by examiner

*Primary Examiner*—Mark Prenty
(74) *Attorney, Agent, or Firm*—Lada & Parry LLP

(57) ABSTRACT

A semiconductor package includes a semiconductor chip provided with a first surface having a bonding pad, a second surface opposing to the first surface and side surfaces; a first redistribution pattern connected with the bonding pad and extending along the first surface from the bonding pad to an end portion of the side surface which meets with the second surface; and a second redistribution pattern disposed over the first redistribution pattern and extending from the side surfaces to the first surface. In an embodiment of the present invention, in which the first redistribution pattern connected with the bonding pad is formed over the semiconductor chip and the second redistribution pattern is formed over the first redistribution pattern, it is capable of reducing a length for signal transfer since the second redistribution pattern is used as an external connection terminal. It is also capable of processing data with high speed, as well as protecting the semiconductor chip having weak brittleness, since the semiconductor package is connected to the substrate without a separate solder ball.

12 Claims, 8 Drawing Sheets

SEMICONDUCTOR PACKAGE ADAPTED FOR HIGH-SPEED DATA PROCESSING AND DAMAGE PREVENTION OF CHIPS PACKAGED THEREIN AND METHOD FOR FABRICATING THE SAME

CROSS-REFERENCE TO RELATED APPLICATIONS

The present application claims priority to Korean patent application number 10-2007-0076007 filed on Jul. 27, 2007, which is incorporated herein by reference in its entirety.

BACKGROUND OF THE INVENTION

The present invention relates generally to a semiconductor package and a method for fabricating the same, and more particularly to a semiconductor package with increased data speed and storage capacity and a method for fabricating the same.

Recently, the development in the semiconductor manufacturing technology has allowed the manufacture of a semiconductor package having a semiconductor device adapted to process more data within a short time.

Generally, a semiconductor device is fabricated through a semiconductor chip fabrication process which includes: fabricating semiconductor chips over a silicon wafer formed of high purity silicon, a die sorting process for testing electrically the fabricated semiconductor chips, and a packaging process for packaging a good semiconductor chip.

Recently, due to technical development in a packaging process, there has been developed a chip scale package having a size of no other than 100% to 105% of a semiconductor chip size and a stacked semiconductor package in which a plurality of semiconductor chips are stacked as an attempt to enhance the data storage capacity and data processing speed.

BRIEF SUMMARY OF THE INVENTION

Embodiments of the present invention are directed to a semiconductor package, which is adapted for high-speed data processing, prevention of damage of semiconductor chips and stack of the semiconductor chips by improving the structure thereof.

In one embodiment, a semiconductor package may comprise a semiconductor chip provided with a first surface having a bonding pad, a second surface opposing the first surface and side surfaces; a first redistribution pattern connected with the bonding pad and extending along the first surface from the bonding pad to an end portion of the side surface which meets with the second surface; and a second redistribution pattern disposed over the first redistribution pattern and extending from the side surfaces to the first surface.

An included angle between the side surface and the first surface is an obtuse angle and an included angle between the second surface and the side surface is an acute angle.

The semiconductor package may further comprise an insulation layer pattern interposed between the first surface and the first redistribution pattern and having an opening for exposing the bonding pad.

The first and second redistribution patterns in an embodiment of the present invention may include the same material.

The first redistribution pattern includes a material selected from the group consisting of copper, gold, aluminum, and metal alloy thereof.

The first redistribution pattern has a first thickness and the second redistribution pattern has a second thickness thicker than the first thickness.

The semiconductor package may further comprise a molding member for covering the semiconductor chip and selectively exposing the second redistribution pattern.

The semiconductor package may further comprise an anti-corrosion member disposed over the second redistribution pattern for preventing corrosion of the second redistribution pattern which would occur if exposed to air.

The anti-corrosion member may be a plated layer.

The plated layer includes one selected from the group consisting of gold, nickel, titanium, and metal alloy thereof.

The anti-corrosion member may be a molding member for covering exposed side and bottom surfaces of the second redistribution pattern and exposing an upper surface of the second redistribution pattern.

The anti-corrosion member may further include a plated layer disposed over an upper surface of the second redistribution pattern that is left exposed when the molding member covers only the exposed side and bottom surfaces.

The semiconductor package may further comprise a substrate having a connection pad connected electrically with the second redistribution pattern.

A solder is interposed between the connection pad and the second redistribution pattern.

Further, embodiments of the present invention are directed to a method for fabricating a semiconductor package, which is adapted for high speed data processing, prevention of damage of semiconductor chips and stack of the semiconductor chips by improving the structure thereof.

In another embodiment, a method for fabricating a semiconductor package may comprise forming trench along a cutting area interposed between a pair of adjacent first and second semiconductor chips, each semiconductor chip having a bonding pad; forming a preliminary first redistribution pattern for connecting the bonding pads of the first and second semiconductor chips via the trench; forming a preliminary second redistribution pattern for covering the preliminary first redistribution pattern formed over the trench; polishing rear surface of the first and second semiconductor chips until the preliminary second redistribution pattern in the trench is exposed from the rear surface of the first and second semiconductor chips; and forming first and second redistribution patterns by cutting the preliminary first and second redistribution patterns at the cutting area.

The method for fabricating a semiconductor package may further comprise, before the step of forming the trench, forming an insulation layer pattern having respective bonding pad of the first and second semiconductor chips.

The step of forming the trench includes forming a photoresist pattern having an opening for exposing the cutting area over upper surfaces of the first and second semiconductor chips; and etching the cutting area into a groove shape using the photoresist pattern as an etching mask.

The step of forming the preliminary first redistribution pattern includes forming a seed metal layer over the upper surfaces of the first and second semiconductor chips to cover the bonding pads; forming over the seed metal layer a photoresist pattern having a slit shaped opening extending from the bonding pad of the first semiconductor chip to the bonding pad of the second semiconductor chip; forming the preliminary first redistribution pattern for connecting the bonding pad of the first and second semiconductor chips using the seed metal layer exposed by the opening; removing the photoresist pattern from the seed metal layer; and patterning the seed metal layer using the preliminary first redistribution pattern as an etching mask to form a seed metal pattern.

The step of forming the preliminary second redistribution pattern includes forming a photoresist pattern having an opening for exposing the trench and the preliminary first redistribution pattern disposed at a vicinity of the trench; forming the preliminary second redistribution pattern over the preliminary first redistribution pattern using the photoresist pattern; and removing the photoresist pattern.

The step of forming the preliminary second redistribution pattern further includes, after the step of removing the photoresist pattern, enclosing the first and second semiconductor chips with a molding member; polishing the molding member to expose the preliminary second redistribution pattern from upper surfaces of the first and second semiconductor chips; and polishing the molding member to expose the preliminary second redistribution pattern corresponding to the trench from the rear surface of the first and second semiconductor chips.

In the step of cutting the preliminary second redistribution pattern, the preliminary second redistribution pattern is cut using laser beam.

The method for fabricating a semiconductor package may further comprise, after the step of cutting the preliminary second redistribution pattern, electrically connecting the second redistribution pattern to a connection pad formed in the substrate.

The method for fabricating a semiconductor package may further comprise, after the step of cutting the preliminary second redistribution pattern, stacking the semiconductor packages having the first and second semiconductor chips respectively to make the second redistribution patterns of the first and second semiconductor chips to be in contact electrically with each other; and connecting electrically the second redistribution patterns.

In the method for fabricating a semiconductor package, a solder is interposed between the second redistribution patterns of the semiconductor packages.

The method for fabricating a semiconductor package may further comprise, after the step of cutting the preliminary second redistribution pattern, forming an anti-corrosion member over a surface of the second redistribution pattern.

In the step of forming the anti-corrosion member, the anti-corrosion member is formed by plating method.

DESCRIPTION OF SPECIFIC EMBODIMENTS

Figure 1:
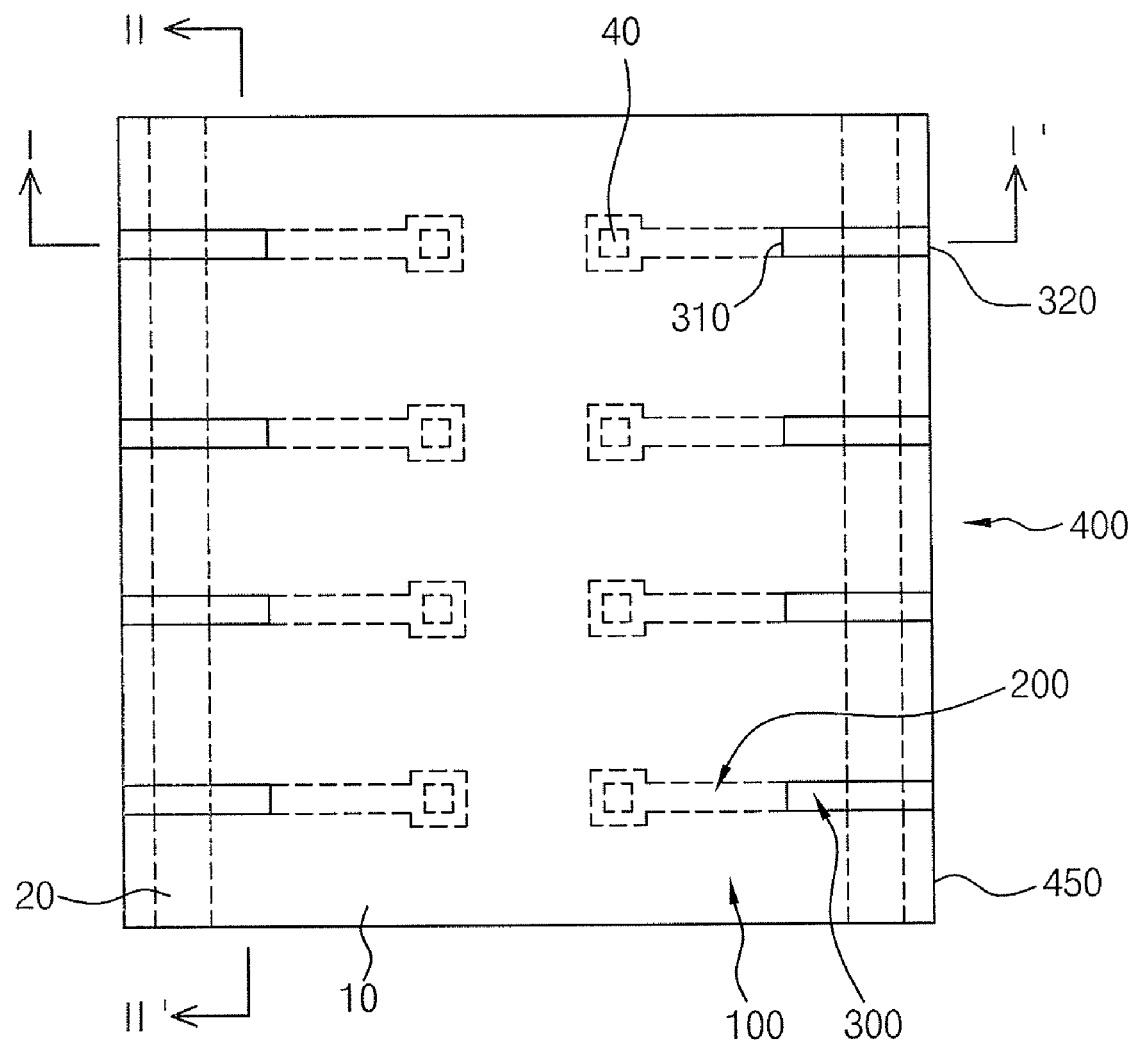
FIG. 1 is a plan view illustrating a semiconductor package in accordance with an embodiment of the present invention.
Figure 2:
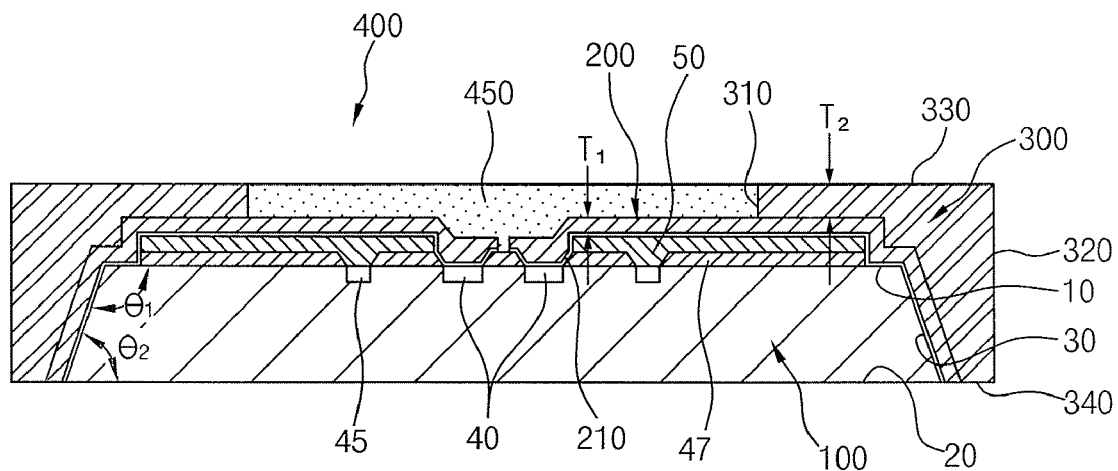
FIG. 2 is a cross-sectional view taken along a line I-I' in FIG. 1.

FIG. 1 is a plan view illustrating a semiconductor package in accordance with an embodiment of the present invention. FIG. 2 is a cross-sectional view taken along a line I-I' in FIG. 1.

Referring to FIGS. 1 and 2, the semiconductor package 400 includes a semiconductor chip 100, a first redistribution pattern 200, and a second redistribution pattern 300. In addition, the semiconductor package 400 may further include a molding member 450.

Referring to FIG. 2, the semiconductor chip 100 has, for example, a trapezoid shape. The semiconductor chip 100 having the trapezoid shape includes a first surface 10, a second surface 20, and the four side surfaces.

The first surface 10 of the semiconductor chip 100 having the trapezoid shape has a first area size. The second surface 20 opposes to the first surface 10 and the second surface 20 has a second area size larger than the first area size. Two side surfaces 30 opposing each other are inclined with respect to the first and the second surfaces 10 and 20, thereby forming the trapezoidal shape.

For example, an included angle θ1 between the first surface 10 and the side surface 30 is an obtuse angle and an included angle θ2 between the second surface 20 and the side surface 30 is an acute angle.

The semiconductor chip 100 having the trapezoid shape includes a data storage part (not shown), a data processing part (not shown), and a bonding pad 40. In addition, the semiconductor chip 100 may further include a fuse box 45 having fuses (not shown) for repairing the data storage part.

The data storage part serves to store data, and the data processing part serves to process data. The bonding pad 40 is electrically connected to the data storage part and/or the data processing part. The bonding pad may be disposed, for example, at the center portion of the first surface 10 of the semiconductor chip 100.

Meanwhile, a passivation layer pattern 47 for exposing the bonding pad 40 and the fuse box 45 may be disposed over the first surface 10 of the semiconductor chip 100. The passivation layer pattern 47 may include an oxide layer and/or a nitride layer. The passivation layer pattern 47 prevents the first surface 10 of the semiconductor chip 100 from being damaged.

The semiconductor chip 100 may further include an insulation layer pattern 50 disposed over the passivation layer pattern 47. The insulation layer pattern 50 has an opening for exposing the bonding pad 40, and the insulation layer pattern 50 covers the fuse box 45 of the semiconductor chip 100. Since the insulation layer pattern 50 covers the fuse box 45, an electrical short circuit between the fuse of the fuse box 45 and the first redistribution pattern 200, which will be described later, may be prevented. In addition, the insulation pattern 50 absorbs stress generated between the first redistribution pattern 200 and the semiconductor chip 100 and thus prevents deflection and damage of the semiconductor chip 100 and/or the first redistribution pattern 200.

Referring to FIG. 1 again, the first redistribution pattern 200 is disposed over the insulation layer pattern 50. The first redistribution pattern 200 is also disposed over the first surface 10 and the inclined side surfaces 30.

The first redistribution pattern 200 has a linear shape when viewed from above. A first end portion of the first redistribution pattern 200 is electrically connected to the bonding pad 40 disposed at the center portion of the first surface 10.

A second end portion of the first redistribution pattern 200, which opposes the first end, extends to the side surface 30 along the first surface 10. The other end portion of the first redistribution pattern 200 extends to an end of the side surface 30 where the side surface 30 meets with the second surface 20. The first redistribution pattern 200 may include, for example, copper, gold, aluminum, and metal alloy thereof and the like.

Referring again to FIG. 2, in a case where the first redistribution pattern 200 is formed by a plating method, a seed metal pattern 210 is interposed between the first redistribution pattern 200 and the insulation layer pattern 50. The seed metal pattern 210 substantially has the same shape and size as the first redistribution pattern 200. Examples of material that may be used as the seed metal pattern 210 include copper, titanium, nickel, vanadium, and metal alloy thereof and the like.

The first redistribution pattern 200 has a first thickness T1 when measured from the seed metal pattern 210.

The second redistribution pattern 300 is disposed over the first redistribution layer 200. The second redistribution pattern 300 extends from the side surface of the semiconductor chip 100 to the first surface 10.

Referring to FIGS. 1 and 2, the second redistribution pattern 300 has a first end portion 310, a second end portion 320, a upper surface 330, and a bottom surface 340.

The first end portion 310 is disposed, for example, over the first redistribution pattern 200 disposed over the first surface 10. The first end portion 310 of the second redistribution pattern 300 is at a predetermined distance from the bonding pad 40 disposed over the first surface 10.

The second end portion 320 of the second redistribution pattern 300 opposes the first end portion 310. For example, the first and second end portions 310 and 320 are disposed substantially perpendicular to the first surface 10 or the second surface 20. The upper surface 330 and the bottom surface 340 are disposed parallel to the first and second surfaces 10 and 20.

Examples of the material that may be used as the second redistribution pattern 300 include copper, gold, aluminum, and metal alloy thereof and the like. In the present embodiment, the second redistribution pattern 300 and the first redistribution pattern 200 may be made with or include substantially the same material.

The second redistribution pattern 300 disposed over the first surface 10 has a second thickness T2, which is thicker than the first thickness T1 when measured from the first redistribution pattern 200.

In the present embodiment, the second redistribution pattern 300 serves as a connection terminal connected to a terminal of an external circuit substrate, which will be described later, without a solder ball.

Figure 3:
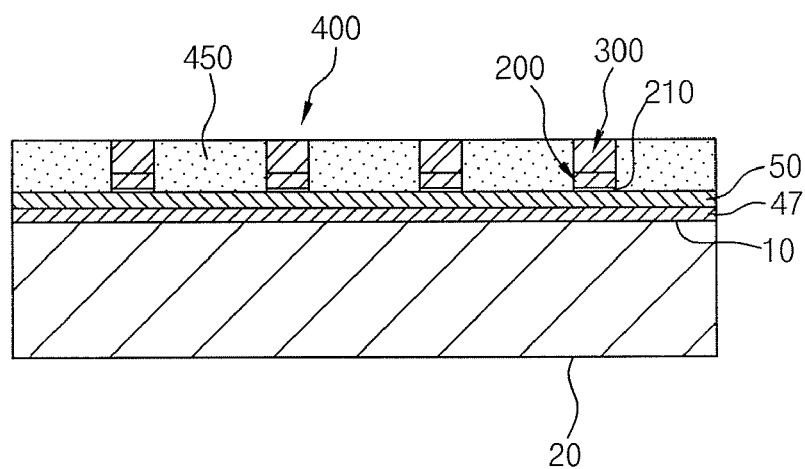
FIG. 3 is a cross-sectional view taken along a line II-II' in FIG. 1.

FIG. 3 is a cross-sectional view taken along a line II-II' in FIG. 1.

Referring to FIGS. 2 and 3, the molding member 450 included in the semiconductor package 400 exposes selectively the upper surface 330 and the second end portion 320 of the second redistribution pattern 300 while covering the first redistribution pattern 200 not covered by the second redistribution pattern 300. Examples of the material that may be used as the molding member 450 include epoxy resin and the like.

Figure 4:
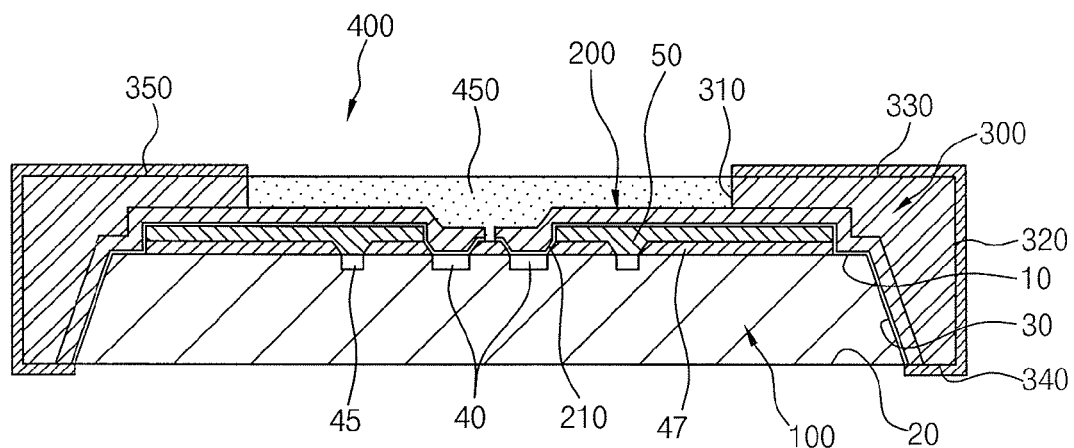
FIG. 4 is a cross-sectional view illustrating a semiconductor package in which an anti-corrosion member is disposed over a second redistribution pattern shown in FIG. 2.

FIG. 4 is a cross-sectional view illustrating a semiconductor package in which an anti-corrosion member is disposed over the second redistribution pattern shown in FIG. 2.

Referring to FIGS. 2 and 4, in a case where the second redistribution pattern 300 includes copper, etc., the second redistribution pattern 300 is rapidly oxidized due to oxygen contained in the air; and thus an oxide layer is formed over a surface of the second redistribution pattern 300. In the case that the oxide layer is formed over a surface of the second redistribution pattern 300, the electrical connection property between the second redistribution pattern 300 and a terminal of a circuit substrate is significantly lowered.

In order to prevent the formation of the oxide layer over the second redistribution pattern 300, which serves as a connection terminal for connection to the terminal of the circuit, an anti-corrosion member 350 is formed over the surface of the second redistribution pattern 300.

The anti-corrosion member 350 may be selectively formed. For example, when considering the second redistribution pattern 300, the upper surface 330, the second end portion 320, and the bottom surface 340, may not be protected by the molding member 450. The anti-corrosion member 350 may then be selectively formed over these unprotected portions.

In the embodiment, the anti-corrosion member 350 may be, for example, a plated layer formed using the second redistribution pattern 300. Examples of the material that may be used as anti-corrosion member 350 include gold, nickel, titanium, and metal alloy thereof and the like.

Figure 5:
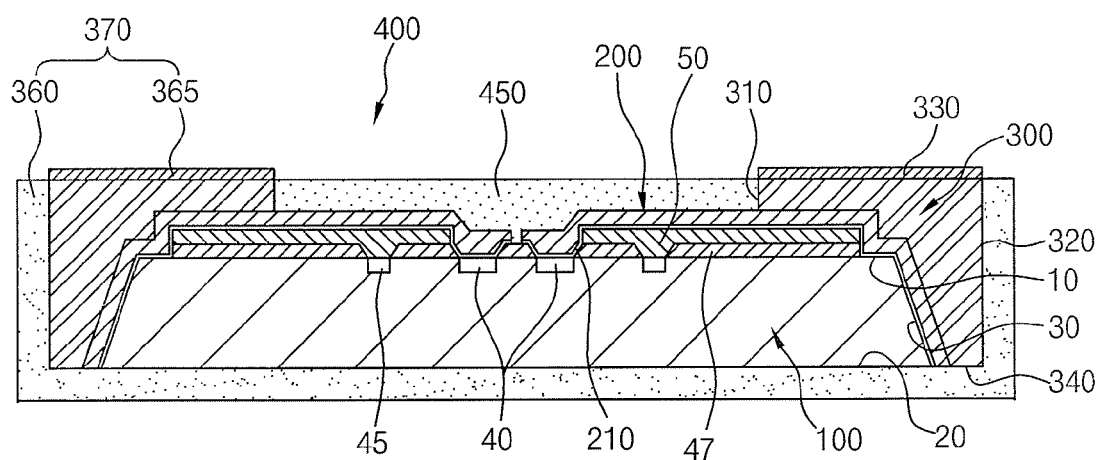
FIG. 5 is a cross-sectional view illustrating a semiconductor package in which another example of the anti-corrosion member is disposed over the second redistribution pattern shown in FIG. 2.

FIG. 5 is a cross-sectional view illustrating a semiconductor package in which another example of the anti-corrosion member is disposed over the second redistribution pattern shown in FIG. 2.

Referring to FIGS. 2 and 5, in a case where the second redistribution pattern 300 includes copper, etc., the second redistribution pattern 300 is rapidly oxidized due to oxygen contained in air; and thus an oxide layer is formed over a surface of the second redistribution pattern 300. In the case where the oxide layer is formed is over a surface of the second redistribution pattern 300, the electrical connection property between the second redistribution pattern 300 and a terminal of a circuit substrate is significantly lowered.

In order to prevent the formation of the oxide layer over the second redistribution pattern 300, which serves as a connection terminal for connection with the terminal of the circuit, an anti-corrosion member 370 is formed over the surface of the second redistribution pattern 300.

The anti-corrosion member 370 includes a molding member 360 and a plated layer 365.

The molding member 360 covers the second end portion 320 and the bottom surface 340 of the second redistribution pattern 300, which are both in contact with air. In addition, the molding member 365 may cover the second surface 20 of the semiconductor chip 100 as well as the second end portion 320 and the bottom surface 340 of the second redistribution pattern 300. In the case that the molding member 360 covers the second surface 20 of the semiconductor chip 100, damage to the semiconductor chip 100 due to vibration and impact from outside sources may be prevented. Examples of the material that may be used as the molding member 360 include epoxy resin and the like.

In the case where the second end portion 320 and the bottom surface 340 of the second redistribution pattern 300 are covered using the molding member 360, the upper surface 330 of the second redistribution pattern 300 is exposed to air; and thus an oxide layer may be formed over the upper surface 330 of the second redistribution pattern 300. In order to prevent the formation of the oxide layer over the upper surface 330 of the second redistribution pattern 300, the plated layer 365 may be disposed over the upper surface 330 of the second redistribution pattern 300.

Figure 6:
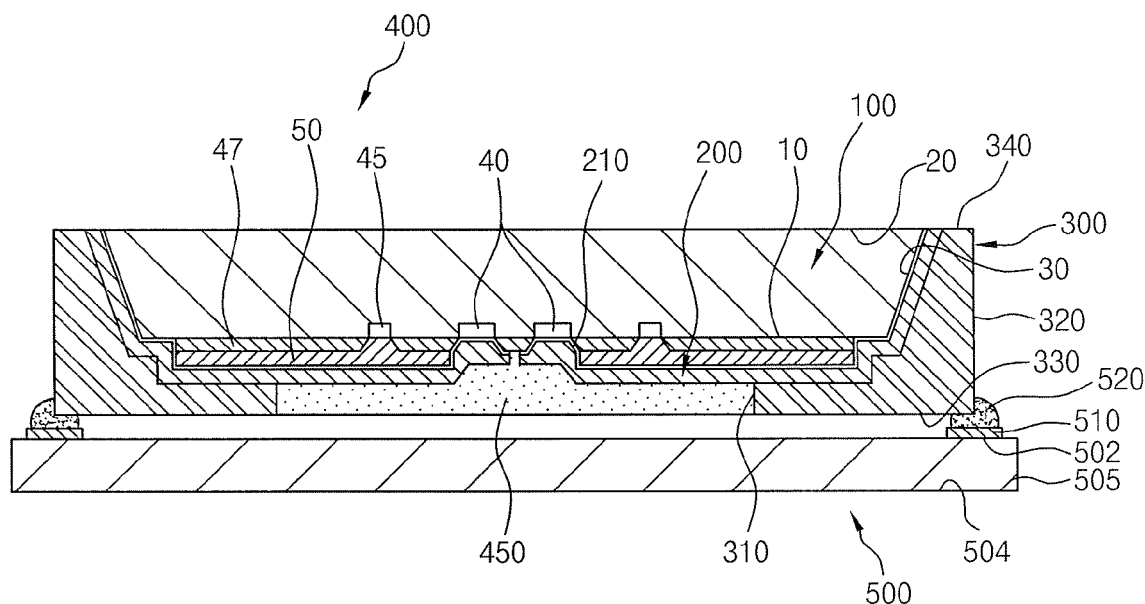
FIG. 6 is a cross-sectional view illustrating a semiconductor package including a substrate connected to the second redistribution pattern shown in FIG. 2.

FIG. 6 is a cross-sectional view illustrating a semiconductor package including a substrate connected to the second redistribution pattern shown in FIG. 2.

Referring to FIG. 6, the semiconductor package 400 may further include a substrate 500. The substrate 500 includes a substrate body 505 and a connection pad 510.

The substrate body 505 has, for example, a plate shape, and the substrate body 505 has an upper surface 502 and a lower surface 504 opposing to the upper surface 502. In the present embodiment, the substrate body 505 may be a printed circuit board.

The connection pad 510 is disposed over the upper surface 502 of the substrate body 505. The connection pad 510 is disposed where it is electrically connected with the second redistribution pattern 300. The connection pad 510 and the second redistribution pattern 300 may be directly electrically connected, for example, by a thermo compression bonding. Alternatively, to electrically connect the connection pad 510 and the second redistribution pad 300 to each other with lower temperature and lower pressure, a solder 520 may be interposed between the connection pad 510 and the second redistribution pad 300. The solder 520 is selectively interposed, for example, between the second redistribution pad 300 and the connection pad 510.

In the present embodiment, though a single semiconductor package is shown and described, it is possible to realize a stacked semiconductor package in which at least two semiconductor packages are stacked using the semiconductor package. In the stacked semiconductor package, the second redistribution patterns of respective semiconductor packages are electrically connected to each other, and, for example, a solder, which is a metal having low melting point, may be interposed between the second redistribution patterns.

As is apparent from the above description, in an embodiment of the present invention, in which the first redistribution pattern connected with the bonding pad is formed over the semiconductor chip and the second redistribution pattern is formed over the first redistribution pattern, it is capable of reducing a length for signal transfer since the second redistribution pattern is used as an external connection terminal. It is also capable of processing data with high speed, as well as protecting the semiconductor chip having weak brittleness, since the semiconductor package is connected to the substrate without a separate solder ball.

FIGS. 7 through 15 are cross-sectional views and plan views illustrating the process steps of a method for fabricating the semiconductor package in accordance with an embodiment of the present invention.

Figure 7:
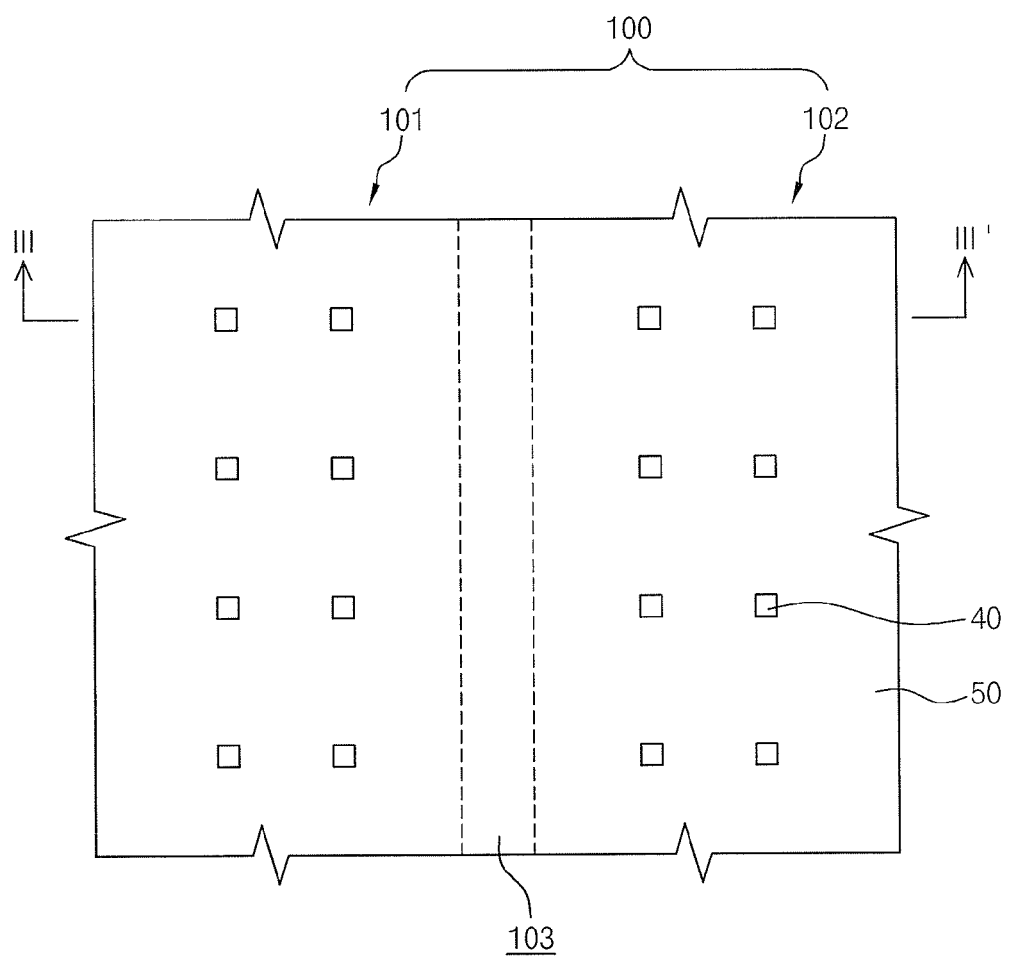
FIGS. 7 through 15 are cross-sectional views and plan views illustrating the process steps of a method for fabricating the semiconductor package in accordance with an embodiment of the present invention.
Figure 8:
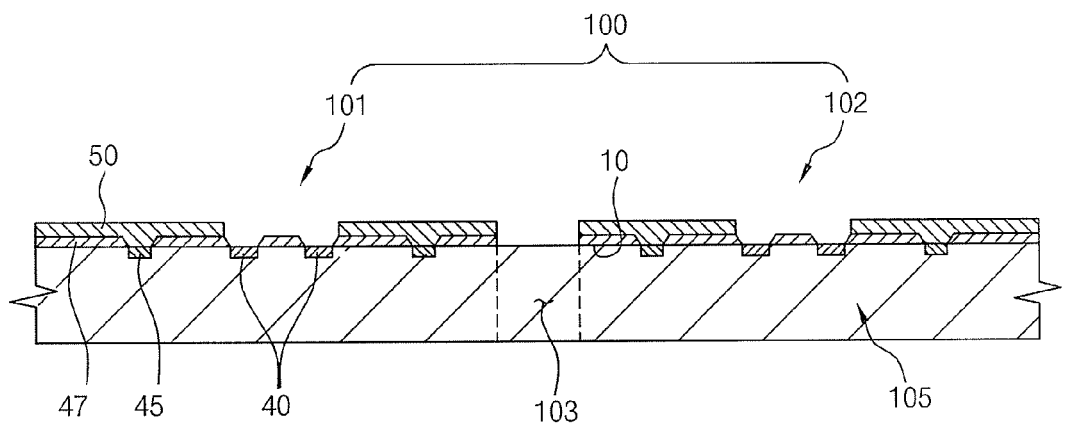

FIG. 7 is a plan view illustrating an insulation pattern having openings for exposing the bonding pads of the semiconductor chips formed over a wafer. FIG. 8 is a cross-sectional view taken along a line III-III' in FIG. 7.

Referring to FIGS. 7 and 8, a semiconductor fabrication process for forming the semiconductor chips 100 over a wafer 105 is performed in order to fabricate the semiconductor package. In the present embodiment, the semiconductor chips 100 which are disposed adjacent to each other over the wafer 105 will be defined, for example, as a first semiconductor chip 101 and a second semiconductor chip 102.

The first and second semiconductor chips 101 and 102 formed over the wafer 105 by the semiconductor fabrication process have a data storage part (not shown) for storing data, a data processing part (not shown) for processing data and a bonding pads 40. The bonding pads 40 are electrically connected with the data storage part and/or the data processing part. Reference numeral 47 is the fuse box, which includes the fuses for repairing the data storage part.

Meanwhile, a cutting area 103 is formed for singulating the first and second semiconductor chips 101 and 102 between the first and second semiconductor chips 101 and 102 formed over the wafer 105.

After the first and second semiconductor chips 101 and 102 are formed over the wafer 105, the passivation layer pattern 47 for exposing the bonding pad 40 and the fuse box 45 is formed over the first and second semiconductor chips 101 and 102.

In order to form the passivation layer pattern 47, a passivation layer (not shown) is formed over the entire area of the first surface 10 of the first and second semiconductor chips 101 and 102, each of which is formed with a bonding pad 40. The passivation layer may be, for example, an oxide layer and/or nitride layer.

After the passivation layer is formed, a photoresist pattern having openings for exposing the bonding pad 40 and the fuse box 45 is formed over the passivation layer, and the passivation layer is patterned using the photoresist pattern as an etching mask, thereby forming the passivation layer pattern 47 having openings for exposing the bonding pad 40 and the fuse box 45.

After the passivation layer pattern 47 is formed over the first and second semiconductor chips 101 and 102, the insulation layer pattern 50 is formed over the passivation layer pattern 47. In order to form the insulation layer pattern 50, an organic layer is formed over the entire area of the passivation layer pattern 47. The organic layer may include, for example, organic matter and photosensitive substance. The organic layer may be formed by a spin coating process.

The organic layer is patterned, for example, by a photo process including an exposure process and a development process, thereby forming the insulation layer pattern 50 for covering the fuse box 45 and having openings for exposing selectively the bonding pads 40.

Figure 9:
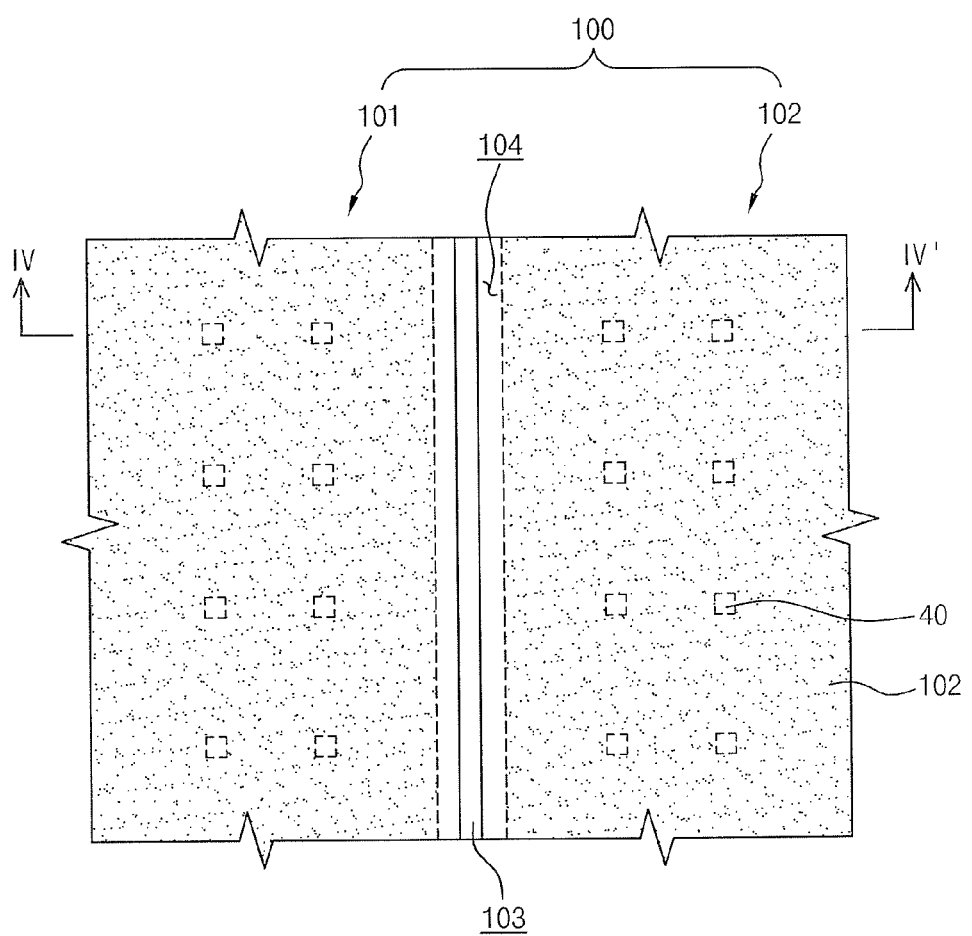
Figure 10:
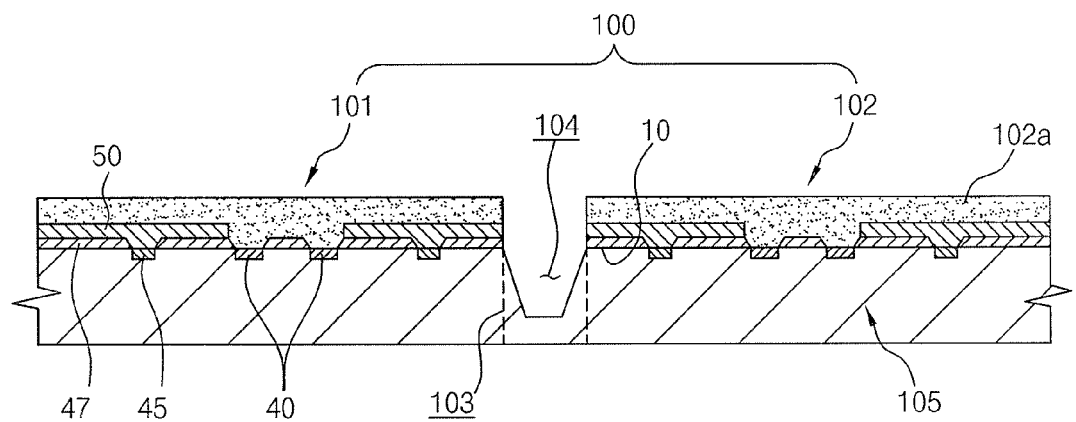

FIG. 9 is a plan view illustrating a trench formed in the cutting area in FIG. 7. FIG. 10 is a cross-sectional view taken along a line IV-IV' in FIG. 9.

Referring to FIGS. 9 and 10, after the insulation layer pattern 50 is formed over the first and second semiconductor chips 101 and 102, a photoresist film (not shown) is formed over the entire area of the first and second semiconductor chips 101 and 102.

The photoresist film is patterned by an exposure process and a photo process, thereby forming a photoresist pattern 102a for exposing the cutting area 103.

The cutting area 103 is formed between the adjacent first and second semiconductor chips 101 and 102 that are formed over the wafer 105. The cutting area is patterned using the photoresist pattern 102a as an etching mask, and thus a trench 104 having a predetermined depth is formed in the cutting area 103. The cutting area 103 may be patterned, for example, by a reactive ion etching (RIE) process. In the present embodiment, the depth of the trench may be about 200 μm to about 250 μm.

After the trench 104 is formed, the photoresist pattern 102a covering the insulation layer pattern 50 is removed by an ashing process or a strip process.

Figure 11:
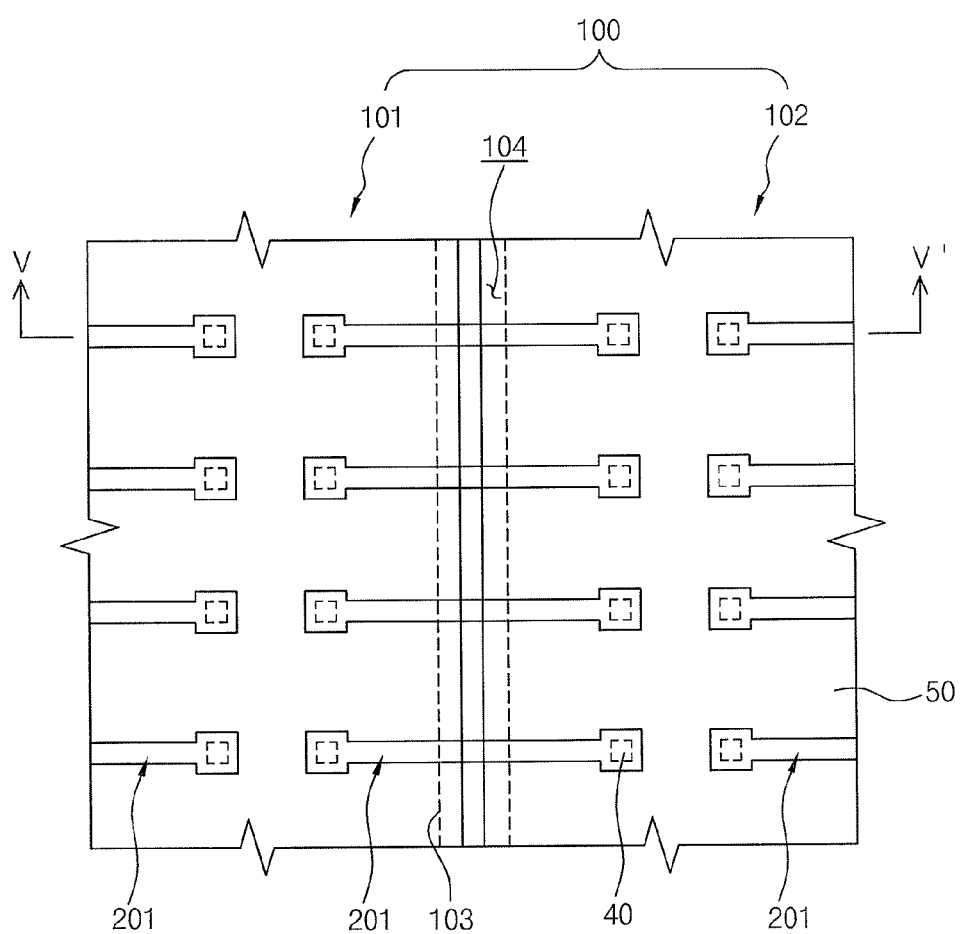
Figure 12:
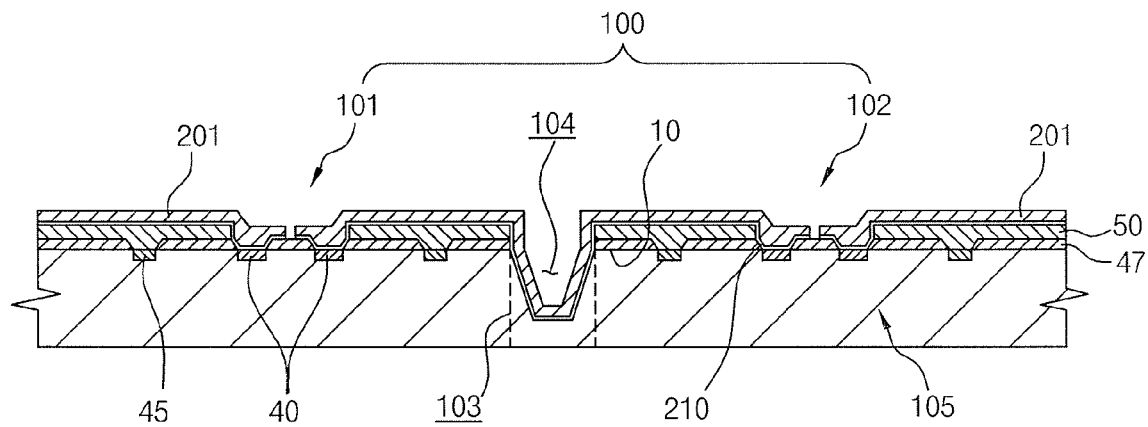

FIG. 11 is a plan view illustrating a preliminary first redistribution pattern formed over the insulation layer pattern shown in FIG. 10. FIG. 12 is a cross-sectional view taken along a line V-V' in FIG. 11.

Referring to FIGS. 11 and 12, after the trench 104 is formed in the cutting area 103, the insulation layer pattern 50 and the trench 104 are covered with a seed metal layer (not shown). The seed metal layer may be formed over the insulation layer pattern 50 by a chemical vapor deposition (CVD) process or a physical vapor deposition (PVD) process as a sputtering process. Examples of material that may be used as the seed metal layer include copper, titanium, nickel, vanadium, and metal alloy thereof and the like.

After the insulation layer pattern 50 and the trench 104 are covered with a seed metal layer, a photoresist film is formed over the seed metal layer. The photoresist film is patterned by a photo process including an exposure process and a development process, and thus a photoresist pattern having openings is formed over the seed metal layer. The opening of the photoresist pattern has substantially the same shape and size as the preliminary first redistribution pattern 201 shown in FIG. After the photoresist pattern having openings is formed over the seed metal layer, the preliminary first redistribution pattern 201 is selectively formed, for example, by a plating method, over the seed metal layer which is exposed through the opening of the photoresist pattern.

The preliminary first redistribution pattern 201 extends from the bonding pad 40 of the first semiconductor chip 101 to the bonding pad 40 of the second semiconductor chip 102 via the trench, thereby connecting electrically the bonding pads 40 of the first and second semiconductor chips 101 and 102.

The preliminary first redistribution pattern 201 is formed, for example, at a first thickness. Examples of material that may be used as the preliminary first redistribution pattern 201 formed at the first thickness may include copper, gold, and aluminum alloy thereof and the like.

After the preliminary first redistribution pattern 201 is formed, the photoresist pattern disposed over the seed metal layer is removed from the seed metal layer by an ashing process or a strip process.

Subsequently, the seed metal layer exposed by the preliminary first redistribution pattern 201 is patterned using the preliminary first redistribution pattern 201 as an etching mask, and thus a seed metal pattern 210 is formed at a lower portion of the preliminary first redistribution pattern 201. The seed metal pattern 210 has substantially the same shape and size as the preliminary first redistribution pattern 201.

Figure 13:
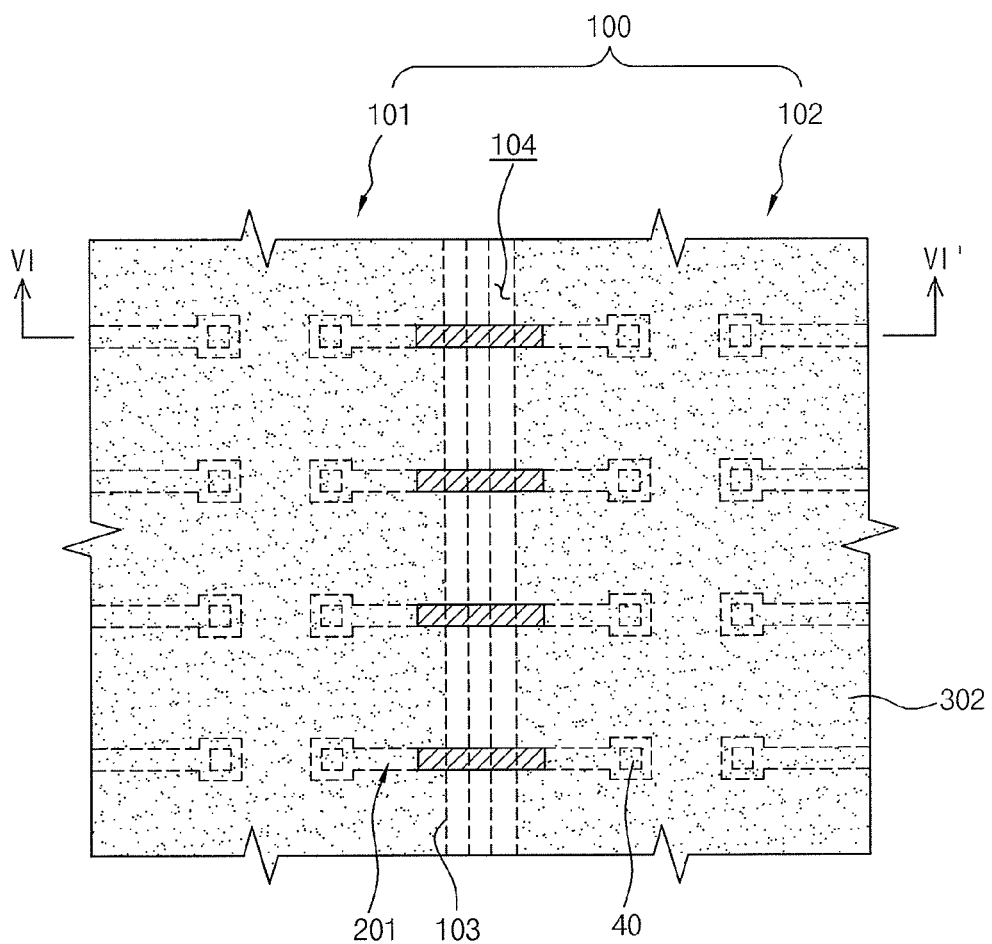
Figure 14:
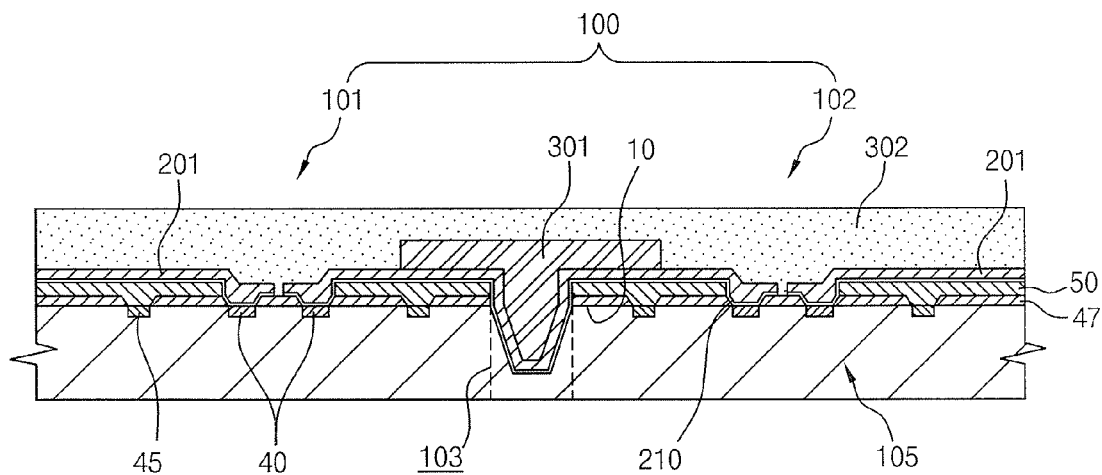

FIG. 13 is a plan view illustrating that a preliminary second redistribution pattern is formed over the preliminary first redistribution pattern shown in FIG. 11. FIG. 14 is a cross-sectional view taken along a line VI-VI' in FIG. 13.

Referring to FIGS. 13 and 14, after the preliminary first redistribution pattern 201 is formed over the insulation layer pattern 50, a photoresist film (not shown) covering the preliminary first redistribution pattern 201 is formed over the insulation layer pattern 50. The photoresist film is patterned by a photo process including an exposure process and a development process, and thus a photoresist pattern (not shown) is formed over the insulation layer pattern 50. The photoresist pattern has a trench 104 and an opening for opening a periphery of the trench 104. The opening of the photoresist pattern has a slit shape when viewed from the above.

After the photoresist pattern is formed over the insulation pattern 50, a preliminary second redistribution pattern 301 is formed over the preliminary first redistribution pattern 201 exposed by the opening of the photoresist pattern. The preliminary second redistribution pattern 301 may be formed, for example, by a plating process using the photoresist pattern as a plating mask. Examples of material that may be used as the preliminary second redistribution pattern 301 may include copper, gold, and aluminum alloy thereof and the like.

In the present embodiment, the preliminary first redistribution pattern 201 and the preliminary second redistribution pattern 301 include, for example, a substantially same material. Also, the preliminary second redistribution pattern 301 may have a second thickness, which is thicker than the first thickness of the preliminary first redistribution pattern 201.

After the preliminary second redistribution pattern 301 is formed over the preliminary first redistribution pattern 201, the photo resist pattern is removed from the insulation layer pattern 50 by an ashing process or a strip process.

After the photoresist pattern is removed from the insulation layer pattern 50, the preliminary first and second redistribution patterns 201 and 301 are molded with a molding member 302 including epoxy resin, etc.

Figure 15:
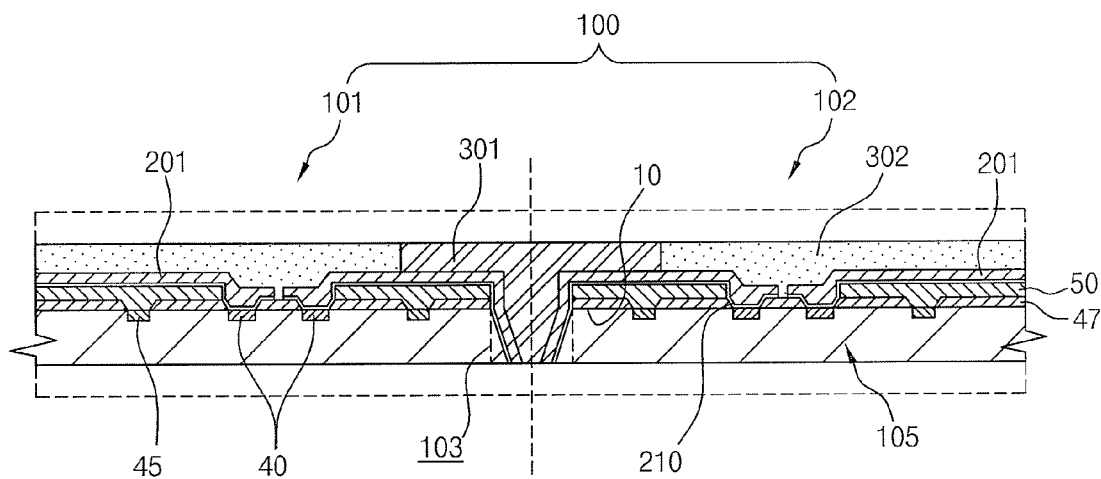

FIG. 15 is a cross-sectional view illustrating a cutting of the preliminary first and second redistribution patterns 201 and 301 shown in FIG. 14.

Referring to FIG. 15, after the molding member 302 covering the preliminary first and second redistribution patterns 201 and 301 is formed over the insulation layer pattern 50, the molding member 302 is polished, for example, by chemical mechanical polishing (CMP) until the preliminary second redistribution patterns 301 disposed over the first and second semiconductor chips 101 and 102 are exposed.

Meanwhile, a lower surface of the molding member is polished, for example, by CMP until the preliminary second redistribution patterns 301, which is disposed over lower surfaces opposing the upper surfaces of the first and second semiconductor chips 101 and 102, is exposed.

Subsequently, the preliminary first and second redistribution patterns 201 and 301 are cut along the center portion of the trench 104 using a laser cutting device, and thus the first and second semiconductor chips 101 and 102 are singulated as shown in FIG. 2. As the result, the semiconductor packages 400 including the first and second redistribution patterns 200 and 300 are fabricated.

At this time, at least two semiconductor packages 400 formed by singulating the first and second semiconductor chips 101 and 102 are stacked, and the second redistribution patterns 300 of the stacked semiconductor packages 400 are electrically connected to each other, thereby realizing a stacked semiconductor package.

The second redistribution patterns 300 of the stacked semiconductor packages 400 are electrically connected to each other, for example, by a thermo compression bonding process. Alternatively, the second redistribution patterns 300 of the stacked semiconductor packages 400 may be electrically connected to each other by interposing a solder between the second redistribution patterns 300 of the stacked semiconductor packages 400 and melting the solder.

After the semiconductor package 400 is fabricated, in order to prevent corrosion of the second redistribution pattern 300 of the semiconductor package 400 which is exposed to air, the anti-corrosion member 350 may be formed over the surface of the second redistribution pattern 300 as shown in FIG. 4. In the present embodiment, the anti-corrosion member 350 may be formed, for example, by a plating method.

Alternatively, after the semiconductor package 400 is fabricated, in order to prevent corrosion of the second redistribution pattern 300 of the semiconductor package 400 which is exposed to air, an anti-corrosion member 370 having a molding member and a plated layer as shown in FIG. 5 may be formed.

After fabricating the semiconductor package 400 including the first and second redistribution pattern 200 and 300, the second redistribution pattern 300 of the semiconductor package 400 may be electrically connected with the connection pad 510 formed over the substrate 500 as shown in FIG. 6. At this time, the second redistribution pattern 300 and the connection pad 510 may be electrically connected with each other by a melted solder.

As is apparent from the above description, an embodiment of the present invention, in which the first redistribution pattern connected with the bonding pad is formed over the semiconductor chip and the second redistribution pattern is formed over the first redistribution pattern, is capable of reducing a length for signal transfer since the second redistribution pattern is used as an external connection terminal. It is also capable of processing data with high speed, as well as protecting the semiconductor chip having weak brittleness, since the semiconductor package is connected to the substrate without a separate solder ball.

Although a specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a semiconductor chip formed with a first surface, a second surface opposing the first surface, and side surfaces connected to the first and second surfaces, the semiconductor chip having a bonding pad formed on the first surface;
   a first redistribution pattern connected to the bonding pad and elongated over the first surface and one of the side surfaces extending to the end of the side surface connecting the second surface; and
   a second redistribution pattern formed over the first redistribution pattern and extending from the side surface to the first surface.

2. The semiconductor package according to claim 1, wherein the angle between the side surface and the first surface is an obtuse angle and the angle between the second surface and the side surface is an acute angle.

3. The semiconductor package according to claim 1, further comprising:
   an insulation layer pattern interposed between the first surface and the first redistribution pattern and having an opening for exposing the bonding pad.

4. The semiconductor package according to claim 1, wherein the first and second redistribution patterns are made from a same material.

5. The semiconductor package according to claim 4, wherein the first redistribution pattern includes one of copper, gold, aluminum, and a metal alloy thereof.

6. The semiconductor package according to claim 1, wherein the first redistribution pattern is formed to a first thickness and the second redistribution pattern is formed to a second thickness thicker than the first thickness.

7. The semiconductor package according to claim 1, further comprising:
   a molding member for covering the semiconductor chip and selectively exposing the second redistribution pattern.

8. The semiconductor package according to claim 1, further comprising:
   an anti-corrosion member disposed over the second redistribution pattern for preventing corrosion of the second redistribution pattern.

9. The semiconductor package according to claim 8, wherein the anti-corrosion member is a molding member for covering the exposed side and bottom surfaces of the second redistribution pattern and leaving exposed an upper surface of the second redistribution pattern.

10. The semiconductor package according to claim 9, wherein the anti-corrosion member further includes a plated layer disposed over an upper surface of the second redistribution pattern which is left exposed by the molding member.

11. The semiconductor package according to claim 1, further comprising:
   a substrate having a connection pad connected electrically with the second redistribution pattern.

12. The semiconductor package according to claim 11, wherein a solder is interposed between the connection pad and the second redistribution pattern.

* * * * *